United States Patent [19]
Hibbard

[11] Patent Number: 5,686,806
[45] Date of Patent: Nov. 11, 1997

[54] LOW-PASS FILTER AND ELECTRONIC SPEED CONTROL SYSTEM FOR ELECTRIC MOTORS

[75] Inventor: John F. Hibbard, Oconomowoc, Wis.

[73] Assignee: Trans-Coil, Inc., Milwaukee, Wis.

[21] Appl. No.: 358,698

[22] Filed: Dec. 19, 1994

[51] Int. Cl.$^6$ ........................................ H02P 5/00
[52] U.S. Cl. ........................ 318/800; 363/96; 307/105
[58] Field of Search ............................... 318/729, 817, 318/798–815; 307/105; 361/111; 363/44–47, 40, 50, 52, 56, 96, 126

[56] References Cited

U.S. PATENT DOCUMENTS

| | | | |
|---|---|---|---|
| 3,668,507 | 6/1972 | Kadomsky et al. | 363/126 |
| 3,675,110 | 7/1972 | Kelly, Jr. | 363/50 |
| 4,206,395 | 6/1980 | Okuyama et al. | 318/716 |
| 4,330,817 | 5/1982 | Avar et al. | 363/96 |
| 4,622,474 | 11/1986 | Christl et al. | 307/105 |
| 4,700,288 | 10/1987 | Baraban et al. | 363/96 X |
| 4,864,484 | 9/1989 | Krueger et al. | 363/45 |
| 4,939,486 | 7/1990 | Bergdahl et al. | 363/45 X |
| 5,251,120 | 10/1993 | Smith | 363/44 |

*Primary Examiner*—Jonathan Wysocki
*Attorney, Agent, or Firm*—Godfrey & Kahn, S.C.

[57] ABSTRACT

A three-phase, low-pass filter for use in an electronic speed control system and wherein an adjustable speed drive is disposed in signal transmitting relation relative to an electric motor by an electrical conduit having a predetermined length, and wherein each single-phase circuit of the three-phase, low-pass filter includes an inductor having input and output nodes, a first resistor electrically coupled in parallel to the inductor, a second resistor having input and output nodes, and wherein the input node of the second resistor is electrically coupled to the output node of the inductor, and a capacitor having input and output nodes, and wherein the input node of the capacitor is electrically coupled to the output node of the second resistor, and wherein the low-pass filter is electrically coupled to the electrical conduit and operable to substantially filter out frequencies that tend to excite the natural resonant frequency of the electrical conduit.

18 Claims, 7 Drawing Sheets

EQUIVALENT CIRCUIT FOR LONG
CONDUCTORS

GAIN VS. FREQUENCY
FOR LONG CONDUCTORS

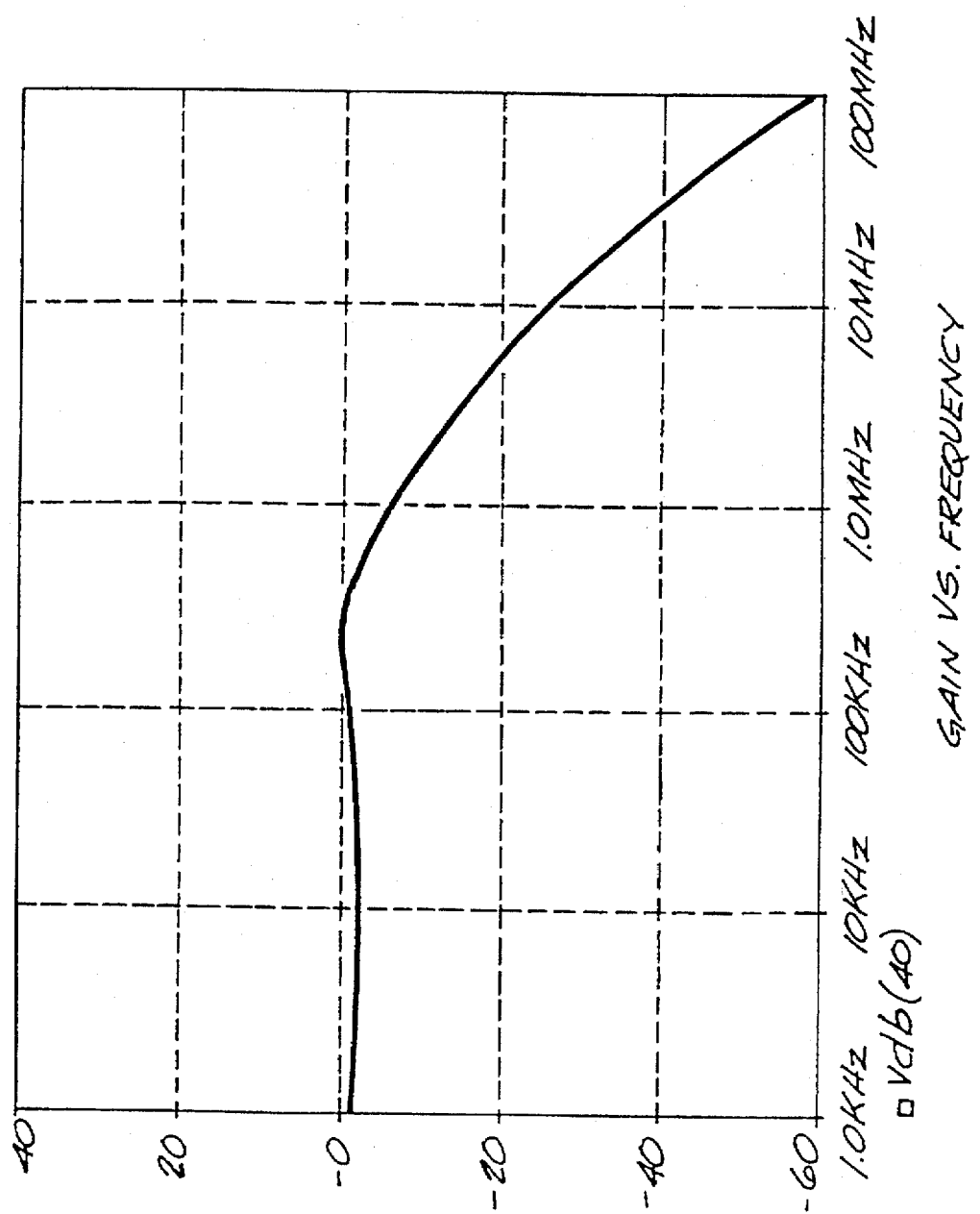

LOW-PASS FILTER AND ELECTRONIC SPEED CONTROL SYSTEM FOR ELECTRIC MOTORS

BACKGROUND OF THE INVENTION

1. Field of the Invention

The present invention relates to a low-pass filter for use in an electronic speed control system having an adjustable speed drive for controlling an AC motor. More particularly, the present invention relates to a low-pass filter for use with an adjustable speed drive which is located at least 50 feet away from the associated AC motor, and which is further operable to impede premature AC motor deterioration occasioned by voltage spikes which are generated by resonance in the electrical conduits which electrically couple the AC motor to the associated drive.

2. Description of the Prior Art

There are many industrial applications where speed control of an AC motor is crucial. For example, precise control of conveyors, hoists, and elevators is critical to their functioning and safe operation. It has long been known that an expedient means of speed control for an AC motor is an adjustable frequency voltage source. Adjustable speed motor drives are employed to generate an appropriate voltage source for an associated AC motor. Generally speaking, an adjustable frequency voltage source is obtained by rectifying the signal from a three-phase AC source to produce a DC signal, and then passing that same DC signal through an inverter. The inverter then converts the DC signal back to a three-phase AC signal having the desired electrical characteristics. Typically, switch-mode DC-to-AC inverters are utilized where the objective is to produce a sinusoidal AC output whose electrical characteristics of both magnitude, and frequency, can be controlled. Such switch-mode DC-to-AC inverters are well known in the art.

The recent availability of high voltage, high current Insulated Gate Bi-Polar Transistors (IGBTs) has led to the wide spread use of IGBTs as the principal switching element in switch-mode DC-to-AC inverters. Presently, nearly all of the manufacturers of AC-to-DC power conversion circuits have developed, or are currently developing, products which utilize these relatively new transistors. One of the principal reasons for the wide-spread use of these transistors is their extremely fast switching times which result in very low device transition losses and, therefore, highly efficient circuits.

Adjustable speed motor drives employing IGBT inverters generate a useful, fundamental voltage and frequency (typically 0 to 460 volts and 0 to 60 hertz for a 480 volt system) by employing a modulation technique known as "Pulse Width Modulation." In this technique, the inverter circuit switches rapidly, producing a carrier having a useful, fundamental voltage and frequency, in a manner similar to amplitude and frequency modulation as employed, for example, in radio, where useful information, music and voice, is transmitted to a radio receiver at some assigned radio frequency. As a general matter, the carrier or switching frequency used for IGBT-based, adjustable-speed motor drives is between 3 and 5 kilohertz.

As was discussed above, the switching times, that is, the time required for a device to transition from the off, or high impedance state, to the on, or lower impedance state, and vice versa, for the latest generation of IGBT devices ranges from slightly below 100 nanoseconds to 200 nanoseconds. Since IGBT inverters are employed in circuits which are supplied with approximately 600 volts DC, for a 480 volt system, the rate of change of voltage with respect to time (DV/DT), can exceed 7,500 volts per micro-second. A spectral analysis of the voltage waveform generated by individual IGBT inverters would reveal frequency components in excess of 1 to 2 megahertz.

As should be appreciated, in industrial applications where the adjustable speed drive is located at least 50 feet away from the motor to be controlled, a condition can occur where the self-resonant frequency of the conductors that electrically couple the motor to the inverter is at, or below, the high frequency components of the voltage waveform produced by the respective IGBT inverter. When this condition exists, the conductors amplify the high frequency components of the voltage waveform that are at, or near, the conductors resonant frequency. This resulting amplification, in turn, generates voltage spikes at the waveform transition points. Such voltage spikes can reach voltage levels in excess of two times the DC voltage which is being supplied to the inverter. For example, in a 480 volt system, it is not uncommon to find voltage spikes in excess of 1,200 to 1,300 volts at the motor terminals. This particular problem is compounded by the fact that these voltage spikes can have a rise time in excess of 7,500 volts per microsecond. As would be expected, the currents generated by these voltage spikes can have an extremely detrimental effect on the motor windings and associated insulation. In this respect, the currents generated by the voltage spikes are often a contributing factor in premature motor burnout. To prevent such premature motor burnout, it is typically recommended that electric motors be operated within certain predetermined operational parameters. For example, in a 480 volt motor application, it is typically recommended that the magnitude of the voltage spikes be confined below 1,000 volts, and that the rate of change of voltage with respect to time, (DV/DT), be less than 1,000 volts per microsecond.

Prior-art attempts to prevent the damaging effects of voltage spikes from reaching associated AC motors have involved the use of assorted filters to remove signals having frequencies between the fundamental frequency of the signal desired to be delivered to the AC motor, and the switching frequency of the IGBT inverter, that is, prior-art filters were designed to remove or impede signals having frequencies in the range of about 60 to 5000 hertz.

In this respect, filters designed to eliminate such low frequencies (60–5,000 hz) are, in general, very large and expensive. To manufacture a filter that will have a propensity for filtering out frequencies of less than about 5 kilohertz, inductors having relatively high inductance (L) and capacitors having relatively high capacitance (C) must be employed. In this regard, inductors and capacitors having high inductance and capacitance are generally expensive, and a filter using such components is normally cumbersome to employ in view of its large size. Moreover, high inductance inductors and high capacitance capacitors are, as a general matter, electrically inefficient. Consequently, a filter for preventing premature motor burnout that could be designed with more efficient, relatively low inductance and capacitance components would be very desirable.

What is needed, therefore, is an electronic speed control system that substantically impedes premature motor burnout. More specifically, what is needed is a low-pass filter which can be employed in an electronic speed control system having an adjustable speed drive, and which substantially eliminates predetermined frequencies of the voltage waveform produced by an IGBT inverter and which tend to excite the natural resonant frequency of the conductors which electrically couple the AC motor to the IGBT inverter.

It would also be desirable to have a filter which is smaller in size, lighter in weight, and which is further less expensive and more efficient than the traditional larger, heavier, and more expensive prior-art filters which were employed to prevent AC motor burnout heretofore.

OBJECTS AND SUMMARY OF THE INVENTION

Therefore, it is an object of the present invention to provide an improved low-pass filter which is operable to reduce frequencies which tend to excite the natural resonant frequency of conductors having a length of at least 50 feet and wherein the conductor electrically couples an adjustable speed drive to an AC motor.

A further object of the present invention is to provide an improved low-pass filter which is operable to reduce the magnitude and rate-of-rise (DV/DT) of voltage spikes.

A further object of the present invention is to provide a low-pass filter for use with adjustable speed drives for AC motors, and which can be constructed from relatively small, lightweight, and inexpensive components.

A further object of the present invention is to provide a low-pass filter for use with adjustable speed drives for AC motors which is highly efficient, and which further avoids many of the detriments which are associated with the prior-art devices and practices.

A further object of the present invention is to provide a low-pass filter for use with adjustable speed drives for AC motors which has a break frequency in the range of about 15 to about 40 kilohertz.

These and other objects and advantages are achieved in a three-phase, low-pass filter of the present invention which is employed in a three-phase electronic speed control system, and wherein an adjustable speed drive is disposed in signal transmitting relation relative to a three-phase electric motor by means of an electrical conduit having a predetermined length, and wherein the low pass filter includes, in each of the low-pass filter's single-phase circuits, an inductor having input and output nodes; a damping resistor electrically coupled in parallel to the inductor; a second resistor having input and output nodes; and wherein the input node of the second resistor is electrically coupled to the output of the inductor; and a capacitor having input and output nodes, and wherein the input node of the capacitor is electrically coupled to the output node of the second resistor; and wherein the low-pass filter is electrically coupled to the electrical conduit, and is operable to substantially filter out frequencies that tend to excite the natural resonant frequencies of the electrical conduit.

Further objects and advantages of the present invention will become more apparent from the following detailed description of the preferred embodiment of the present invention taken in combination with the accompanying drawings.

BRIEF DESCRIPTION OF THE DRAWINGS

FIG. 7 is a plot of the frequency response, in decibels and on an a logarithmic scale (bode plot), of the long conductors of FIG. 5.

FIG. 9 is a plot of the frequency response, in decibels and on a logarithmic scale (bode plot), of long conductors which are electrically coupled to a low-pass filter of the present invention.

DETAILED DESCRIPTION OF THE PREFERRED EMBODIMENT

Figure 1:
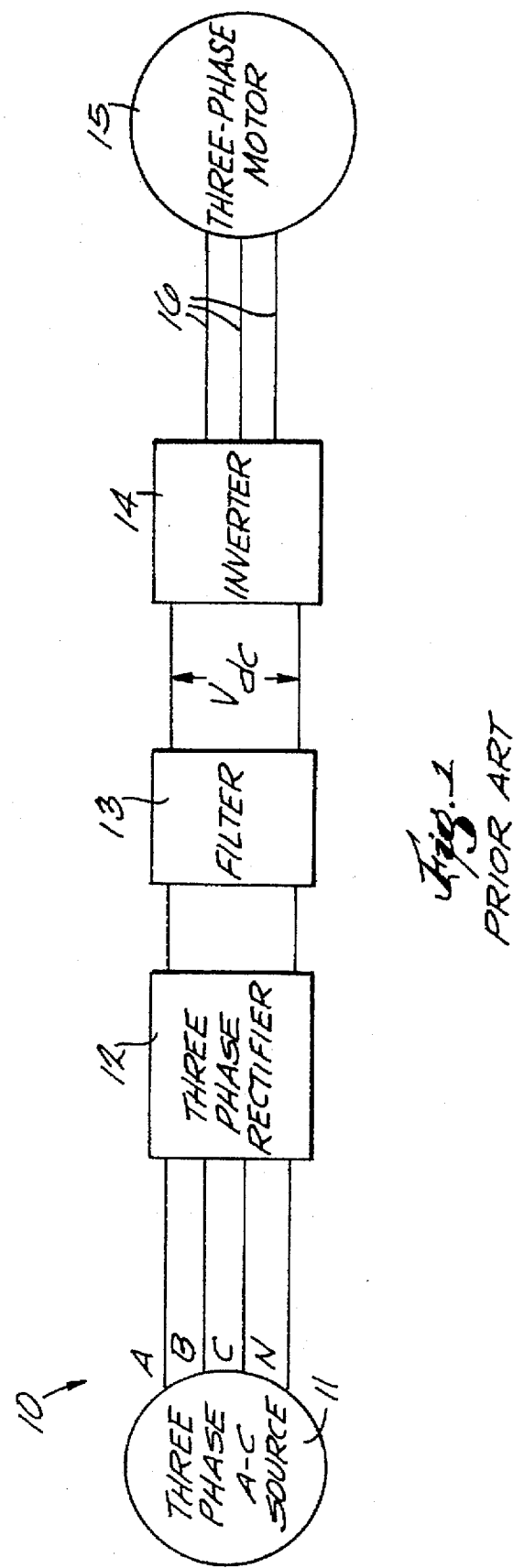
FIG. 1 is a block diagram illustrating the components of a prior-art electronic speed control system.

With reference to the drawings, a prior-art electronic speed control system is shown at numeral 10 in FIG. 1. The prior-art electronic speed control system 10 includes a three-phase AC source 11; a three-phase rectifier 12; a filter 13; and an inverter 14. Coupled to the inverter 14 are electrical conduits or long conductors 16 (not shown to scale) which electrically couple the inverter 14 to a three-phase AC motor 15. For convenience the electrical conduits may be referred to as a single electrical conduit, it being understood that more than one wire or other conduit might be necessary to couple the motor 15 to the inverter 16.

In the prior-art electronic speed control system 10 which is illustrated in FIG. 1, the AC signal from the AC source 11 is rectified by the three-phase rectifier 12. Ripples, or fluctuations, in the output of the rectifier 12 are then removed by filter 13. The resulting DC signal is then inputted to the inverter 14, where a three-phase AC signal having the desired characteristics is produced.

Figure 2:
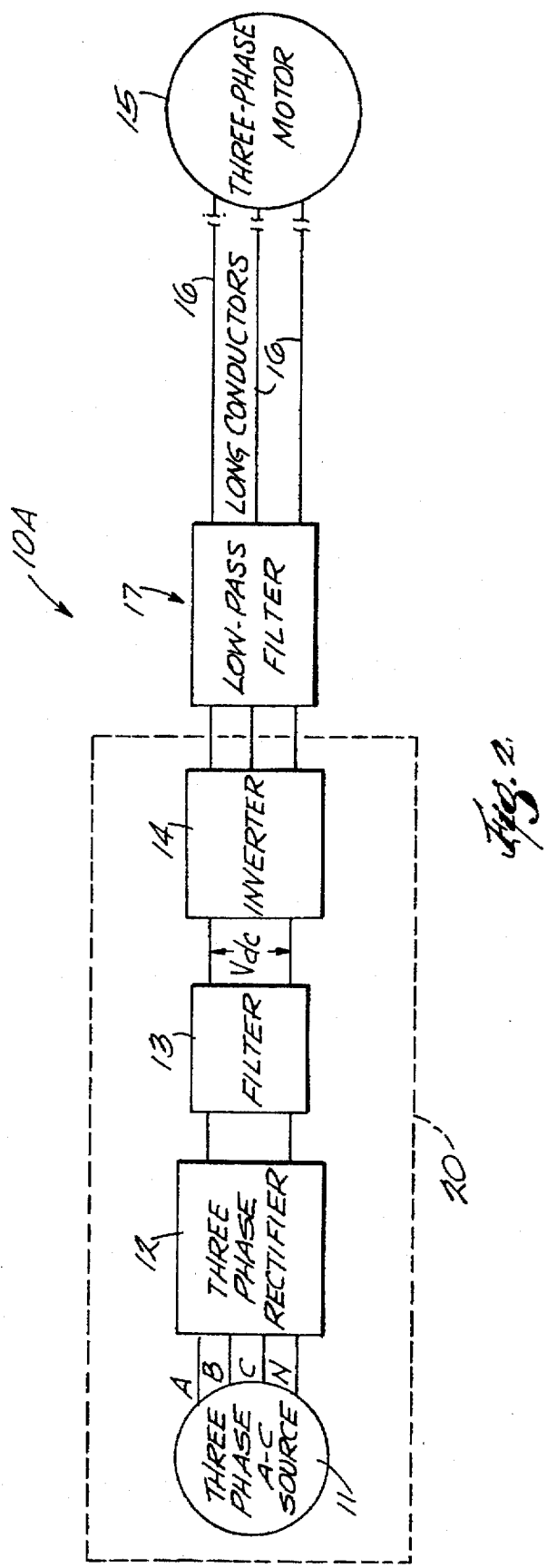
FIG. 2 is a block diagram of an electronic speed control system which employs the present invention, and which illustrates the relative placement of the low-pass filter of the present invention within the electronic speed control system.

An electronic speed control system 10A is shown in FIG. 2. FIG. 2 illustrates the use of a low-pass filter 17 of the present invention and an adjustable frequency voltage source or adjustable speed drive 20. The low-pass filter 17 is electrically coupled to both the adjustable speed drive 20 and the three-phase AC motor 15. In particular, the low-pass filter 17 is coupled between the inverter 14, and the long conductors 16 so as to deliver to the long conductors 16 a signal where substantially all of the high-frequency portions of the inverter's output signal has been filtered out. More specifically, the low-pass filter 17 is operable to filter out those frequencies that tend to excite the natural resonant frequency of the long conductors 16. The natural resonant frequency of the long conductors 16 is determined by the equation: $F_R = 1/2\pi \sqrt{LC}$.

Figure 3:
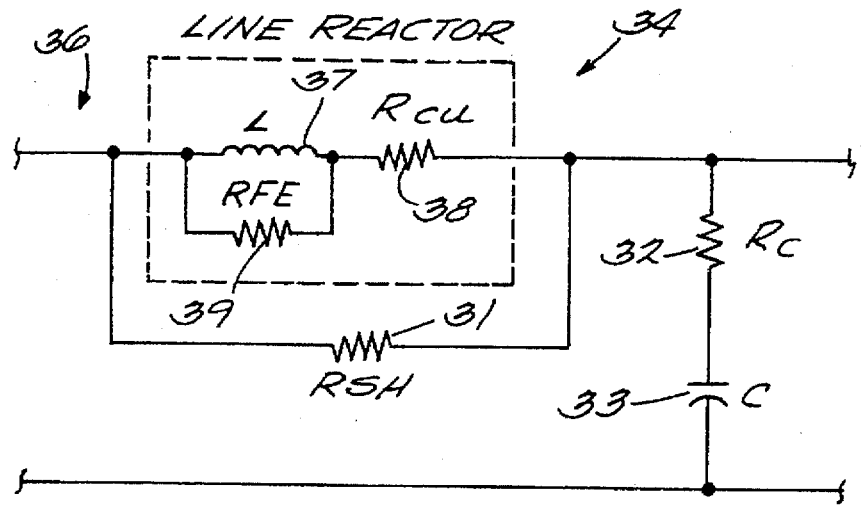
FIG. 3 is a single-phase equivalent circuit diagram of the low-pass filter of the present invention.

The present invention can be better understood by reference to FIG. 3 which illustrates a single-phase equivalent circuit of a low-pass filter 36 constructed in accordance with the present invention. The equivalent circuit of the low-pass filter 36 represents a complete single-phase model. The low-pass filter 36 includes a line reactor 34, a damping resistor 31 which is coupled in parallel to the line reactor 34, a second resistor 32 which is coupled to the output of the line reactor 34; and a capacitor 33 which is coupled in series to the resistor 32. The line reactor 34 may be considered as having an inductor L or 37 which includes a conductive wire, typically a copper wire which is, coiled about an iron core (not shown), and an input and an output. The resistance of the iron core of the inductor L or 37 may be equivalently shown as a resistor $R_{FE}$ or 39 which is coupled in parallel to the inductor L or 37. The resistance of the coiled wire surrounding the iron core may be equivalently shown as a resistor $R_{CU}$ or 38 which is coupled in series to the output of the inductor L or 37.

As should be understood by reference to FIG. 3, low-pass filters constructed in accordance with the teachings of the present invention are designed so that the damping resistance of the low-pass filter is the result of the combination of $R_{FE}$ or 39, $R_{CU}$ or 38, $R_{SH}$ or 31, and $R_C$ or 32.

Figure 4:
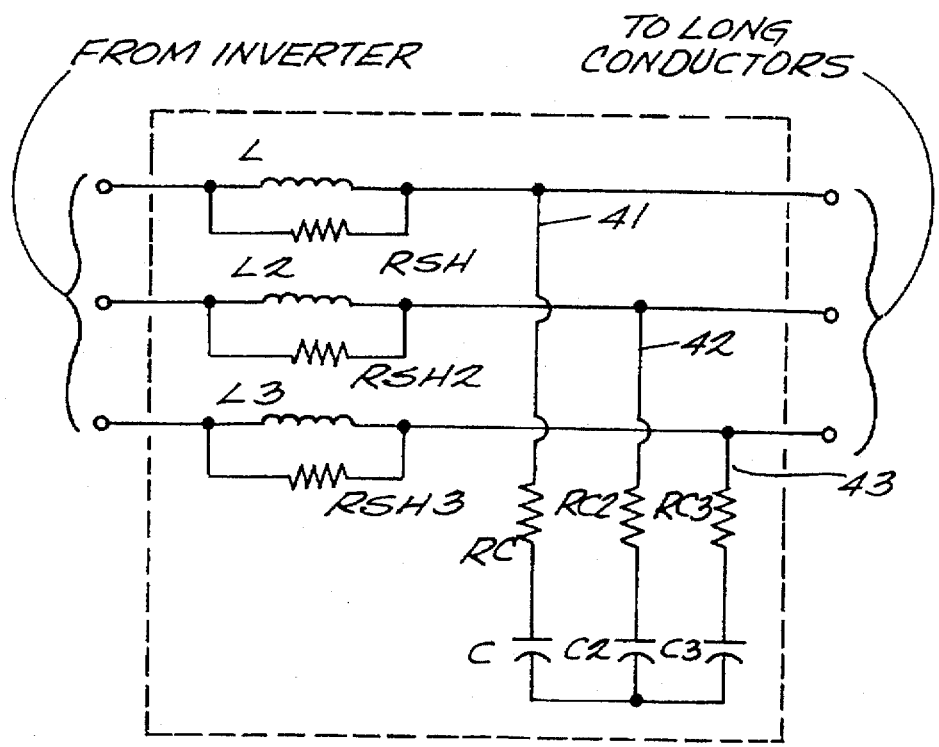
FIG. 4 is a three-phase circuit diagram of the low-pass filter of the present invention.

FIG. 4 illustrates a three-phase circuit for a low-pass filter of the present invention. It is to be understood that the low-pass filter of the present invention contains three equivalent filters 41, 42, and 43 so as to be operable in three-phase systems.

OPERATION OF THE INVENTION

Figure 5:
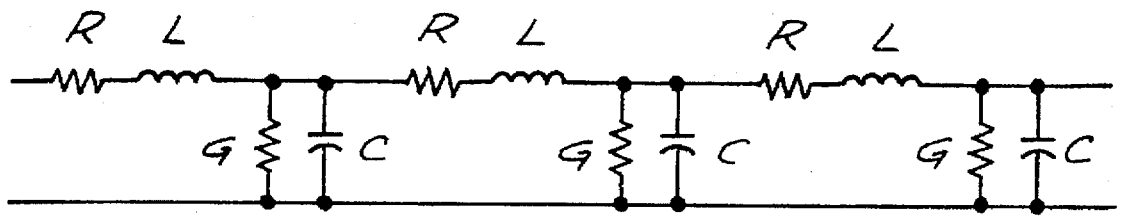
FIG. 5 is a prior-art equivalent circuit diagram used to analyze the behavior of long conductors.
Figure 6:
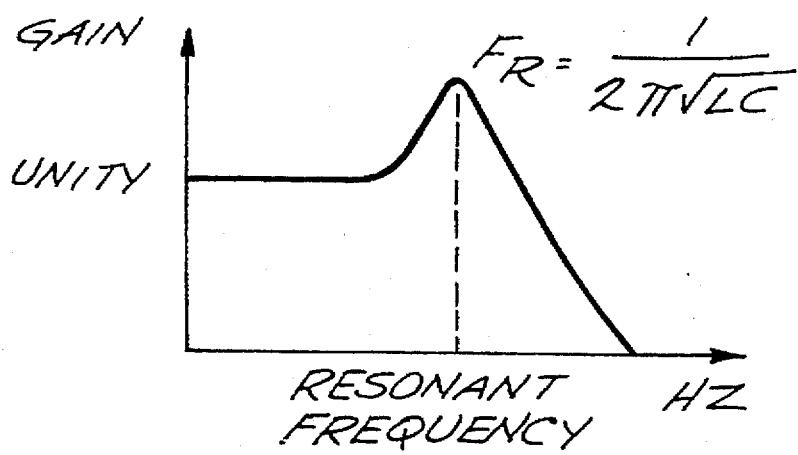
FIG. 6 is a graphical representation of the frequency response for the long conductors of FIG. 5.
Figure 2:
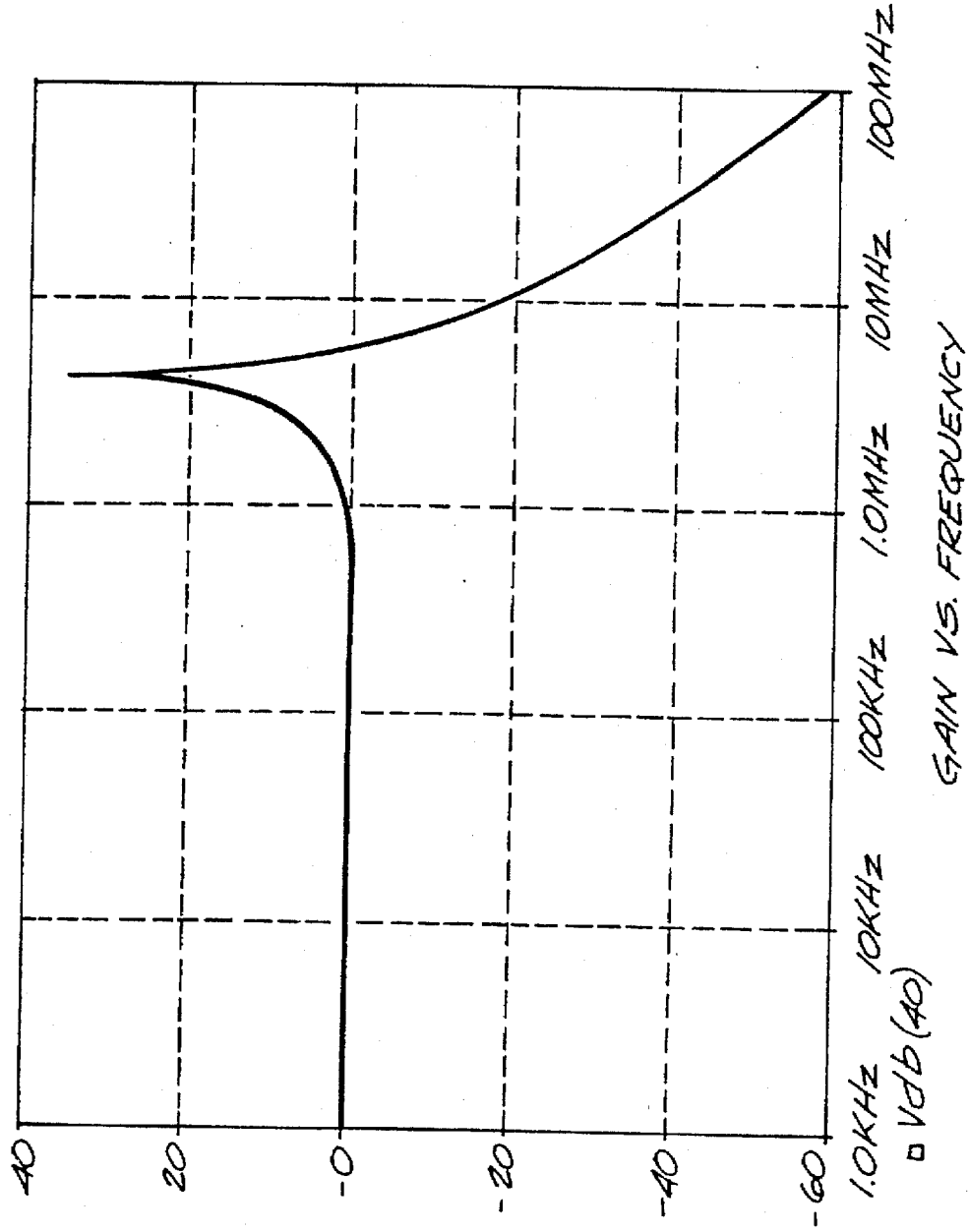

It is well understood in the art that the transmission of AC power on conductors may be analyzed using a single-phase circuit such as, as for example, the equivalent circuit shown in FIG. 5. The circuit illustrated in FIG. 5 shows the resistance, capacitive reactance, and inductive reactance of long conductors and it is known as an RLC, (resistor, inductor, and capacitor) network. As such, the response of the circuit to AC signals is related to the frequency of the input signal. Moreover, an RLC network will display a phenomenon known as resonance. Resonance occurs at a frequency where the capacitive reactance and inductive reactance additively combine to equal zero, that is, at the resonant frequency the impedance of the network is caused solely by the resistance in the individual conductors. Hence, when resonance occurs the overall impedance of the conductors drops, and a gain or voltage spike occurs.

As should be understood, the inductive and capacitive reactance of conductors, or a transmission line, changes as the length of the transmission line varies. Still further, as the inductive and capacitive reactance of the transmission line varies so does its resonant frequency. As discussed earlier, in an electronic speed control system where the transmission line or conductors coupling the inverter to the AC motor are about 50 feet or more in length, a condition can exist where the resonant frequency of the conductors is at, or below, the high frequency components of the voltage waveform produced by the inverter. When this condition exists, voltage spikes of predetermined magnitudes will be transmitted to the AC motor.

Figure 8:
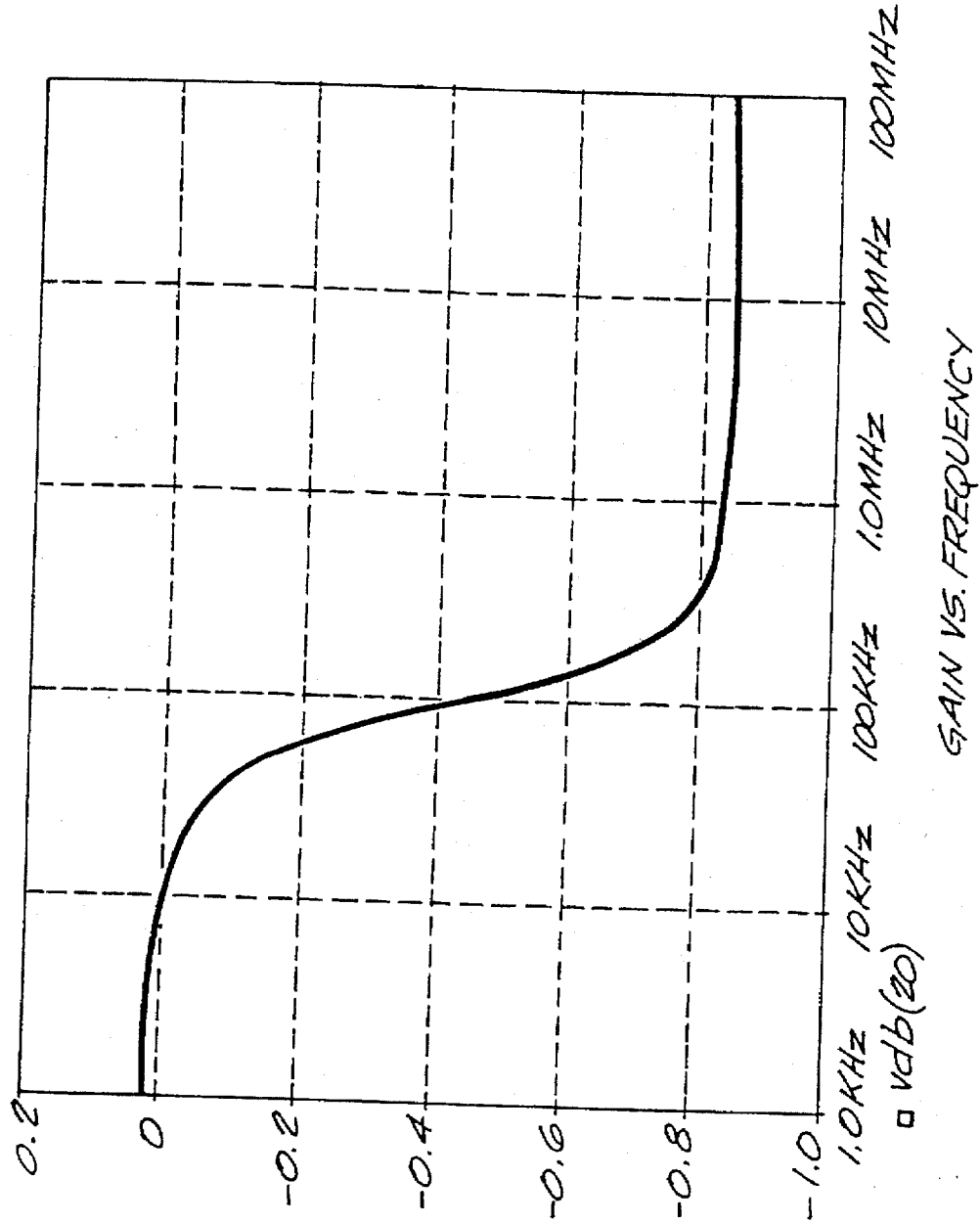
FIG. 8 is a plot of the frequency response, in decibels and on a logarithmic scale (bode plot), of a low-pass filter in accordance with the present invention.

As should be understood, the resonant frequency of individual conductors that are about 50 feet in length, which can be seen by reference to the frequency response illustrated in FIG. 7, is greater than about 1 megahertz. The low-pass filter of the present invention, as can be seen by reference to the frequency response which is illustrated in FIG. 8, blocks the transmission of those frequencies greater than about 400 kilohertz, and has a break frequency, of approximately 20 kilohertz. As is known in the art, ideally a low-pass filter passes signals of certain frequencies, up to some predetermined cutoff frequency, with a given substantially equal amplitude ratio. More specifically, the gain of a low-pass filter is constant until some set point is reached which is termed, the cutoff frequency. When this event occurs, frequencies above the cutoff frequency are not passed by the filter, and are in the filter's stopband. Further, frequencies between 0 hertz and the cutoff frequency are in the passband of the filter. In commercially available low-pass filters, the boundary between the passband and stopband is not distinct. Thus, in practice, the cutoff frequency is called the rolloff or break frequency, and is commonly defined as the point at which the amplitude ratio between the input and the output of the low-pass filter is about 0.7.

Accordingly, coupling the low-pass filter of the present invention between the output of the inverter, and the long conductors leading to the AC motor, as shown in FIG. 2, results in a circuit having the frequency response shown in FIG. 9. As can be seen by comparing FIG. 9 and FIG. 7, the beneficial effect of employing a filter of the present invention is that the voltage spikes occurring between 1 and 10 megahertz are substantially eliminated. Therefore, damage to the AC motor which is occassioned by the resulting voltage spikes is also eliminated.

It has been found that the teachings of the present invention may best be applied in industrial applications where a variety of AC motors are utilized. Summarized below are the component values of the inductor, capacitor, and resistors for various low-pass filters that may be constructed according to the teachings of the present invention. Each of the respective values corresponds to the current rating, in amps, of the AC motor to be used in a given application.

| MOTOR RATING AMPS | L(uH) | C (uF) | BREAK FREQUENCY (kHz) | $R_{SH}$ (OHMS,W) | $R_C$ (OHMS,W) |
|---|---|---|---|---|---|
| 8 | 1380 | 0.047 | 19.8 | 400,25 | 4K,25 |
| 12 | 920 | 0.047 | 24.2 | 400,25 | 4K,25 |
| 16 | 690 | 0.047 | 27.9 | 400,25 | 4K,25 |
| 25 | 440 | 0.100 | 24.0 | 400,25 | 4K,25 |
| 35 | 315 | 0.100 | 28.4 | 400,25 | 4K,25 |
| 45 | 245 | 0.270 | 19.6 | 200,25 | 2K,25 |
| 55 | 200 | 0.270 | 21.7 | 200,25 | 2K,25 |
| 80 | 140 | 0.270 | 25.9 | 100,50 | 1K,50 |
| 110 | 100 | 0.270 | 30.6 | 100,50 | 1K,50 |
| 130 | 85 | 0.680 | 20.9 | 100,50 | 1K,50 |
| 160 | 70 | 0.680 | 23.1 | 100,50 | 1K,50 |
| 200 | 55 | 0.680 | 26.0 | 100,50 | 1K,50 |
| 250 | 44 | 0.680 | 29.1 | 100,50 | 1K,50 |
| 300 | 37 | 0.680 | 31.7 | 100,50 | 1K,50 |
| 360 | 31 | 0.680 | 34.7 | 100,50 | 1K,50 |

An additional feature of the present invention is that the damping resistance of the low-pass filter is a combination of the circuit resistors and the losses of the inductor iron core. The damping resistance is critical because low-pass filters of the present invention, like any other RLC network, have a resonant frequency. When resonance occurs in the filter, the damping resistance minimizes the resulting voltage spikes.

Therefore it will be seen that the present invention provides a convenient means by which premature damage of AC motors located at a predetermined distance from an adjustable speed drive can be greatly reduced. Additionally, the present invention avoids the many shortcomings earlier identified in the prior-art practices and devices which are used to address substantially similar problems by providing a low-pass filter that is relatively inexpensive to manufacture, lightweight, small in size, and which is further energy efficient.

It is to be further understood that the invention is not confined to the particular construction and arrangement of the components herein illustrated and described, but embraces such modified forms thereof as come within the scope of the following claims.

Having described my invention what I claim as new and desire to secure by Letters Patents is:

1. An electronic speed control system including an adjustable speed drive that has an inverter for producing a voltage waveform, the adjustable speed drive disposed in signal transmitting relation to an electric motor by an electrical conductor having a sufficient length so that the resonant frequency of the conductor is at, or below, high frequency components of the voltage waveform, and a low-pass filter, and wherein the low-pass filter comprises:

an inductor having input and output nodes;

a first resistor electrically coupled in parallel to the inductor;

a second resistor having input and output nodes, and wherein the input node of the second resistor is electrically coupled to the output node of the inductor; and a capacitor having input and output nodes, and wherein the input node of the capacitor is electrically coupled to the output node of the second resistor, wherein the low-pass filter is electrically coupled to, and positioned between, the adjustable speed drive and the electrical conductor and is operable to substantially filter out frequencies that tend to excite the electrical conductor to resonate at its resonant frequency.

2. An electronic speed control system as claimed in claim 1, and wherein the low-pass filter has a break frequency between about 15 to about 40 kilohertz.

3. An electronic speed control system as claimed in claim 1, and wherein the predetermined length of the electrical conductor is at least 50 feet.

4. An electronic speed control system as claimed in claim 1, and wherein the inductor has a predetermined resistance, the first resistor has a predetermined resistance, and the low-pass filter has a damping resistance which is the combination of the predetermined resistance of the first resistor and the predetermined resistance of the inductor.

5. An electronic speed control system as claimed in claim 4, and wherein the inductor has a predetermined inductance in the range of about 30 to about 1400 microhenries.

6. An electronic speed control system as claimed in claim 5, and wherein the first resistor has a predetermined resistance in the range of about 100 to about 400 ohms.

7. An electronic speed control system as claimed in claim 6, and wherein the second resistor has a predetermined resistance in the range of about 1 to about 4 kilohms.

8. An electronic speed control system as claimed in claim 7, and wherein the capacitor has a predetermined capacitance in the range of about 0.04 to about 0.7 microfarads.

9. A low-pass filter for use in an electronic speed control system which includes an adjustable speed drive that has an inverter, the adjustable speed drive electrically coupled to an AC motor by one or more electrical conductors each having a length of at least 50 feet, and a resonant frequency that is at, or below, high frequency components of the output of the inverter, the low-pass filter comprising:

an inductor, resistor, and capacitor network, and wherein the low-pass filter is electrically coupled to the one or more electrical conductors and operable to substantially filter out frequencies that tend to excite the one or more electrical conductors to resonance and wherein the low-pass filter has a break frequency between about 15 to about 40 kilohertz.

10. A three-phase, low-pass filter for use in a three-phase electronic speed control system which includes an adjustable speed drive that has an inverter, the adjustable speed drive disposed in signal transmitting relation to an electric motor by one or more electrical conductors each having a sufficient length so that the resonant frequency of each of the conductors is at, or below, high frequency components of the output of the inverter, and wherein each single-phase circuit of the three-phase, low-pass, filter comprises:

an inductor having input and output nodes;

a first resistor electrically coupled in parallel to the inductor;

a second resistor having input and output nodes, and wherein the input node of the second resistor is electrically coupled to the output node of the inductor; and a capacitor having input and output nodes, and wherein the input node of the capacitor is electrically coupled to the output node of the second resistor, and wherein the low-pass filter is electrically coupled to the one or more electrical conductors and operable to substantially filter out frequencies that tend to excite the one or more electrical conduits to resonance.

11. The low-pass filter as claimed in claim 10, and wherein the low-pass filter has a break frequency between about 15 to about 40 kilohertz.

12. The low-pass filter as claimed in claim 10, and wherein the predetermined length of each of the electrical conductors is at least 50 feet.

13. The low-pass filter as claimed in claim 10, and wherein the inductor has a predetermined resistance, the first resistor has a predetermined resistance, and the low-pass filter has a damping resistance which is the combination of the predetermined resistance of the first resistor and the predetermined resistance of the inductor.

14. The low-pass filter as claimed in claim 13, and wherein the inductor has a predetermined inductance in the range of about 30 to about 1400 microhenries.

15. The low-pass filter as claimed in claim 14, and wherein the first resistor has a predetermined resistance in the range of about 100 to about 400 ohms.

16. The low-pass filter as claimed in claim 15, and wherein the second resistor has a predetermined resistance in the range of about 1 to about 4 kilohms.

17. The low-pass filter as claimed in claim 16, and wherein the capacitor has a predetermined capacitance in the range of about 0.04 to about 0.7 microfarads.

18. An electronic speed control system including an adjustable speed drive that has an inverter for producing a voltage waveform, the adjustable speed drive disposed in signal transmitting relation to an electric motor by an electrical conductor having a sufficient length so that the resonant frequency of the conductor is at, or below, high frequency components of the voltage waveform, and a low-pass filter, and wherein the low-pass filter comprises:

an inductor, resistor, and capacitor network, and wherein the low-pass filter is electrically coupled to the one or more electrical conductors and operable to substantially filter out frequencies that tend to excite the electrical conductor to resonate at its resonant frequency and wherein the low-pass filter has a break frequency between about 15 to about 40 kilohertz.

* * * * *